United States Patent [19]

Reynolds

[11] Patent Number: 5,258,757
[45] Date of Patent: Nov. 2, 1993

[54] APPARATUS AND METHOD FOR INCREASING THE OUTPUT IMPEDANCE OF A CURRENT-TYPE DIGITAL-TO-ANALOG CONVERTER

[75] Inventor: David C. Reynolds, Georgetown, Mass.

[73] Assignee: Analog Devices, Incorporated, Norwood, Mass.

[21] Appl. No.: 880,499

[22] Filed: May 8, 1992

[51] Int. Cl.$^5$ .............................................. H03M 1/66
[52] U.S. Cl. ...................................... 341/136; 341/144
[58] Field of Search .............. 341/136, 118, 119, 120, 341/121, 144, 154; 330/285, 288, 296

[56] References Cited

U.S. PATENT DOCUMENTS

| | | | |
|---|---|---|---|
| 4,558,242 | 12/1985 | Tuthill et al. | 307/577 |
| 4,590,456 | 5/1986 | Burton et al. | 341/133 |
| 4,774,497 | 9/1988 | Taylor | 341/118 |
| 4,967,140 | 10/1990 | Groeneveld et al. | 323/315 |

Primary Examiner—Marc S. Hoff
Assistant Examiner—Brian K. Young
Attorney, Agent, or Firm—Parmelee, Bollinger & Bramblett

[57] ABSTRACT

A current-output CMOS DAC with a compensation circuit to increase output impedance. The circuit includes an auxiliary MOS current source matched to at least one of the DAC bit-current sources. A comparator compares the drain voltage of the main MOS current source (which is connected to an external reference current source $I_{ref}$) with the drain voltage of the auxiliary current source. The output of the comparator controls the magnitude and sign of a correction current which is directed to the main current source transistor and thereby alters the bit-current output to reduce the ouput sensitivity to changed conditions.

14 Claims, 1 Drawing Sheet

APPARATUS AND METHOD FOR INCREASING THE OUTPUT IMPEDANCE OF A CURRENT-TYPE DIGITAL-TO-ANALOG CONVERTER

BACKGROUND OF THE INVENTION

1. Field of the Invention

This invention relates to digital-to-analog converters (DACs). More particularly, this invention relates to current-output DACs employing MOS transistor current sources for the bit currents.

2. Description of the Prior Art

Current-type DACs employing MOS current sources have been used for some time now. Examples of such DACs are shown in U.S. Pat. Nos. 4,558,242 (Tuthill and Minogue) and 4,590,456 (Burton and Real). It is important that the DAC output currents not vary with changing conditions such as power supply voltage, temperature or manufacturing process variations. It is known to achieve good output current stability by designing the circuitry to have a high output impedance, so that the output current closely tracks a reference current which may be made to be very constant.

However, obtaining high output impedance by conventional circuit design requires relatively large IC chip areas, and this results in slower speed of operation and uses more chip "real estate" than desirable. Thus, there is a need for an MOS current-output DAC which can be made small, yet still provide nearly constant output currents in the face of changing conditions.

SUMMARY OF THE INVENTION

In a preferred embodiment of the invention, to be described in detail hereinbelow, an MOS current-output DAC is provided with a correction current source which can add or subtract a small amount of correction current to the DAC reference current terminal, i.e., the terminal to which an external reference current source ($I_{ref}$) is connected. Since $I_{ref}$ is an established constant, essentially not variable with changing conditions, adjustment of the correction current at the $I_{ref}$ terminal alters correspondingly the current in the main DAC current source which is connected to the $I_{ref}$ terminal, and to which the bit-current sources all are mirrored. The amount and sign of the correction current is controlled by a comparator which monitors the bit-current magnitudes and adjusts the correction current flowing in the main current source so as to assure proper bit-current magnitudes.

One input of this comparator is connected to the drain of the main DAC current source (i.e., the drain which is connected to the $I_{ref}$ terminal). The other comparator input ideally should be connected directly to the drain of a bit-current source in order to compare the bit-current with the current in the main DAC current source, However, such direct connection to a bit-current source would adversely affect operation of the DAC, and therefore is not practical. Instead, in accordance with one feature of the invention, the other comparator input is connected to the drain of an auxiliary current source which electrically matches the bit-current circuitry of the DAC.

The drain voltage of this auxiliary (or "dummy") MOS current source will track the drain voltage of the MOS bit-current source, due to the matched relationship between the two, and because the current sources all are subject to the same external conditions. Thus, the comparator responds just as though it were comparing the drain voltage ($V_D$) of the main current source with the $V_D$ of the bit-current source.

The source electrodes of these MOS current sources are connected together (to the positive power line) so that the source electrode voltages will necessarily be equal. Thus, comparison of the drain voltages in effect compares the source-to-drain voltages ($V_{DS}$) of the MOS transistors being monitored.

If the comparator finds that the $V_{DS}$ of the dummy current source equals the $V_{DS}$ of the main current source, then the bit current being monitored will be at its "ideal" value, proportional to the external reference current (i.e., at some constant "k" times $I_{ref}$, where "k" is a scaling factor). If there is a difference between these $V_{DS}$ measurements, then the bit-current source has strayed from $k \cdot I_{ref}$. Upon detecting such deviation from ideal, the comparator responds by controllably altering the amount (and sign, if appropriate) of the correction current at the $I_{ref}$ terminal as needed to restore the monitored bit-current to its specified value relative to $I_{ref}$. Thus, this circuitry increases the apparent output impedance of the DAC, by decreasing the degree to which the output current is altered by a changed condition.

Other objects, aspects and advantages of the invention will be pointed out in, or apparent from, the following description of a preferred embodiment of the invention, considered together with the accompanying drawing.

DETAILED DESCRIPTION OF A PREFERRED EMBODIMENT

Figure 1:
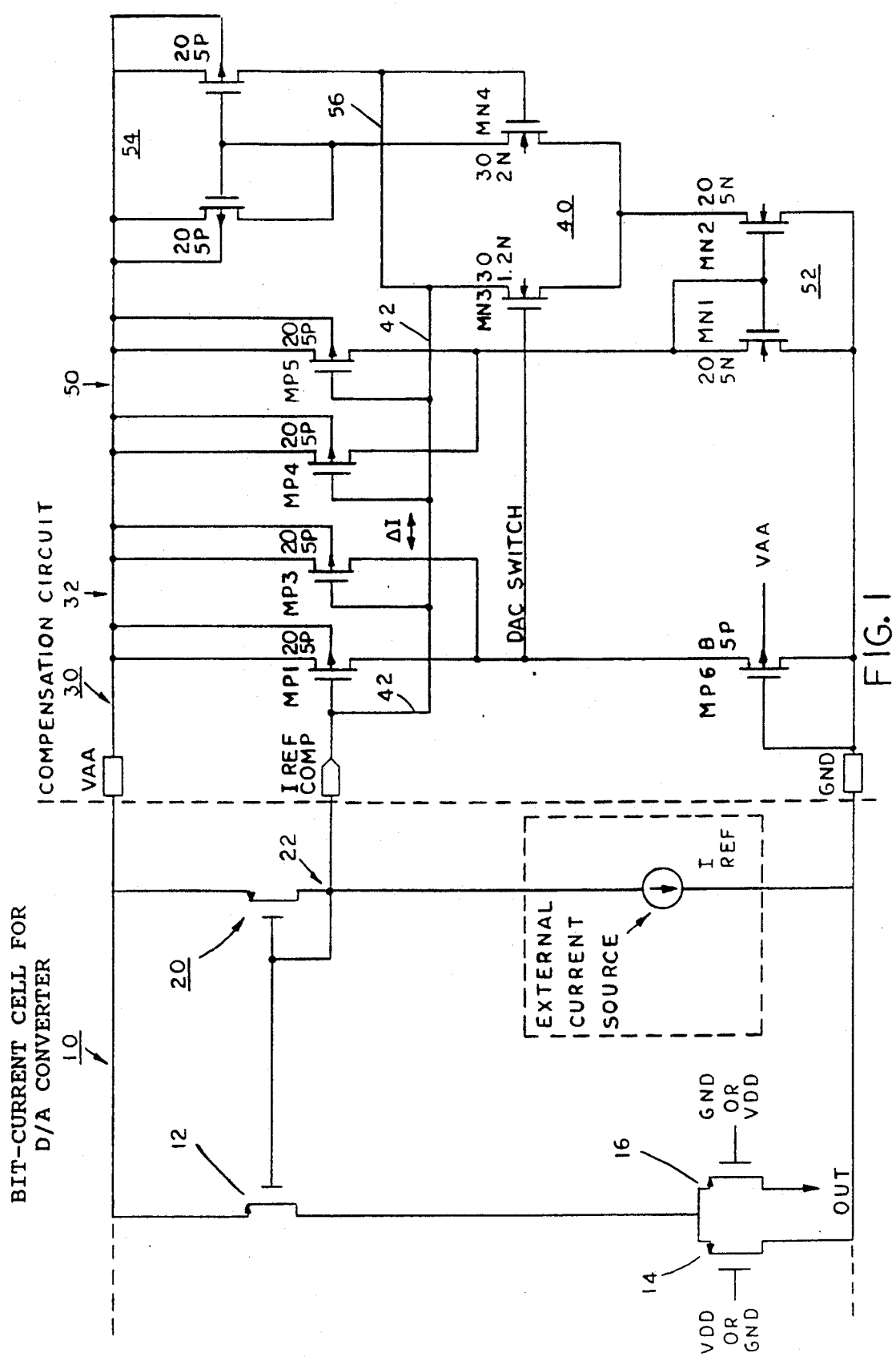
FIG. 1 is a circuit diagram of an integrated circuit embodying the present invention.

Referring now to the left-hand portion of the drawing, there is shown one bit-current cell 10 of a multi-cell D/A converter of the general type described in the above-mentioned U.S. Pat. Nos. 4,558,242 and 4,590,456. Such a bit-current cell includes a source of current which in the present case is an MOS device 12. The output of this device is directed to a pair of complementary MOS switches 14, 16. Such pairs of switches are shown at 22 in FIG. 1 of the above '242 patent. These switches alternatively direct the bit-current either to ground or to an output summing node labelled OUT and serving as the output line for the converter. The DAC will of course include other similar bit-current sources, all with switches producing output currents for this summing node, but these sources and switches have not been shown in order to simplify the presentation.

The bit-current source 12 is mirrored to a main MOS current source 20 the drain of which is connected to a reference terminal 22 for an external current source $I_{ref}$. This external source basically sets the level of current through the main current source 20. Such external sources are designed to be extremely stable so that the magnitude of $I_{ref}$ can for most purposes be considered fixed.

If the DAC current sources (such as 12 and 20) were perfect current sources, the bit-currents would exactly track $I_{ref}$ at a design value providing a predetermined proportional relationship to $I_{ref}$ (i.e., $k \cdot I_{ref}$). However, it is known that in reality the outputs of the DAC bit-current sources will vary from the nominal design values when the current sources are subjected to changed conditions such as variations in the DC supply voltage (VAA).

To minimize such variations in the DAC bit-currents, there is provided (referring now to the right-hand portion of the drawing) a compensation circuit 30 which in effect senses the bit-current levels and makes circuit adjustments (as will be explained) to maintain those levels at very nearly the specified design values. The net effect is that the DAC appears to have a larger output impedance than the DAC without this circuit.

Turning now to this circuit 30 in more detail, it includes an auxiliary or "dummy" current source 32 composed of parallel-connected MOS transistors MP1, MP3 the currents of which flow to ground through an MOS transistor MP6. This current source together with MP6 appears electrically to be the same as the DAC bit-current source 12 with its switches 14, 16. That is, the auxiliary current source 32 will behave in the same manner as the bit-current sources when subjected to changed conditions such as power supply or manufacturing process variations, and so on. Measurements made at this dummy current source therefore can be used to determine the status of conditions at the bit-current source, without however requiring direct connection to the bit-current sources which would cause operational difficulties.

The circuit 30 further includes a comparator 40 for comparing the drain voltage of the auxiliary current source transistor MP1, MP3 with the drain voltage of the main DAC current source 20 (connected to the terminal labelled IREFCOMP). This main current source is diode-connected; that is, its gate is connected to its drain. Thus the gate-to-source voltage $V_{GS}$ equals the source-to-drain voltage $V_{DS}$ for this transistor.

It should be noted that comparator-monitoring of the drain voltages $V_D$ for these current-source transistors effectively monitors the corresponding MOS source-to-drain voltages ($V_{DS}$), because the source electrodes all are at the same potential (VAA). If $V_{DS}$ of the auxiliary current source 32 were found by the comparator 40 to be exactly equal to $V_{DS}$ of the current source 20, then the $V_{DS}$ of the bit-current source 12 of the DAC could be assumed also to be equal to $V_{DS}$ of the main current source. In that event, the actual bit-current could be assumed to be at the design value ($k \cdot I_{ref}$).

However, in the usual case, $V_{DS}$ of these current source transistors 20, 32 will not be equal. That inequality will be sensed by the comparator 40 and the output circuitry of the comparator will, in turn, divert a small amount of correction current into (or out of) the IREFCOMP terminal, via a line 42.

This correction current is supplied by a correction current source 50 including two parallel-connected MOS transistors MP4 and MP5. The output of this correction current source is directed to a mirror 52 which supplies the currents flowing through the transistors MN3 and MN4 of the comparator 40.

If the comparator 40 determines that correction current (I) is to be subtracted from IREFCOMP, so as to increase the current through the main current source 20, the comparator will increase the current through its left-hand comparator transistor MN3, thereby directly drawing current from the IREFCOMP terminal through line 42. If current needs to be added (sourced) to IREFCOMP, so as to decrease the current through the main current source 20, the comparator will increase the current through its right-hand comparator transistor MN4. This transistor current flows through a current mirror 54, and an increased current produces correspondingly increased current through a line 56 to line 42 and thence to the IREFCOMP terminal.

Thus, in either event, the current through the main DAC current source will be adjusted so as to adjust correspondingly the current through the bit-current source 12 (and through the other not-shown bit-current sources slaved thereto). This is an open-loop control arrangement, and the gain of the comparator 40 is set (by sizing MN3, MN4) to provide the desired proper degree of adjustment of current in the main DAC current source 20 which results in a DAC output current extremely close to the specified design value. Thus, the apparent output impedance of the DAC is substantially increased, without a significant increase in required chip area as in prior art designs.

Although a preferred embodiment of the invention has been disclosed herein in detail, it is to be understood that this is for the purpose of illustrating the invention, and should not be construed as necessarily limiting the scope of the invention since it is apparent that many changes can be made by those skilled in the art while still practicing the invention claimed herein. For example, the invention may be provided as an IC chip containing the DAC (as shown) and/or still other circuitry, or it may be provided as a separate chip. Still other variations are readily possible as is known in the art, including different circuit arrangements for achieving the basic functions of the invention as set forth in the accompanying claims.

What is claimed is:

1. For use with a digital-to-analog converter (DAC) of the type having a plurality of bit-current sources, said bit-current sources producing a combined current output at an output node having an output impedance, and wherein a reference current is connected to an $I_{ref}$ terminal of the DAC to supply current to a main MOS transistor current source mirrored to at least one of said DAC bit-current sources, the currents of said bit-current sources being switchable to said output node;

means for increasing the apparent output impedance of the DAC comprising:

auxiliary current source means comprising at least one MOS transistor and matched to at least one of said bit-current sources;

said auxiliary current source being mirrored to said main current source;

a comparator having two inputs and an output;

one of said inputs being connected to one electrode of the MOS transistor of said main current-source;

the other of said inputs being connected to an electrode of said at least one MOS transistor of said auxiliary current source corresponding to said one electrode and developing a voltage responsive to current therethrough;

a correction current source; and means controlled by the output of said comparator for directing to said MOS transistor of said main current source a source/sink current from said correction current source for maintaining the current of said one bit-current source at a desired value.

2. Apparatus as claimed in claim 1, where said main MOS transistor current source includes a drain, said one comparator input being connected to the drain of said main current-source transistor;

said one MOS transistor of said auxiliary current source including a drain;

the other comparator input being connected to the drain of said one transistor of said auxiliary current source.

3. Apparatus as claimed in claim 1, wherein said correction current source comprises at least one MOS transistor.

4. Apparatus as claimed in claim 3, wherein said comparator comprises a pair of MOS transistors each having a gate, said gates of said pair of MOS transistors serving as said two inputs respectively.

5. Apparatus as claimed in claim 4, wherein said correction current source has an output, said apparatus including a current mirror connected between the output of said correction current source and two commonly-connected electrodes of said comparator transistors so that the current is divided between said two transistors.

6. Apparatus as claimed in claim 1, wherein said source/sink current is supplied to said $I_{ref}$ terminal.

7. Apparatus as claimed in claim 6, wherein said one electrode of said main current source transistor is the drain electrode and is connected to said $I_{ref}$ terminal;

said one comparator input being connected to said $I_{ref}$ terminal.

8. Apparatus as claimed in claim 7, wherein said other comparator input is connected to the drain electrode of said auxiliary current source.

9. Apparatus as claimed in claim 1, wherein the gate of said main current-source transistor is connected to the drain of that transistor, to provide a diode connection.

10. For application to a digital-to-analog converter (DAC) of the type having a number of transistor bit-current sources producing a current output having an apparent output impedance, wherein a reference current is supplied to a main transistor current source mirrored to the DAC transistor bit-current sources;

the method of increasing the apparent output impedance of the DAC comprising;

developing an auxiliary current by transistor current source means matched to at least one of said bit-current sources and mirrored to said main current source;

comparing the voltage on one electrode of said main current-source transistor with the voltage on a corresponding electrode of one transistor of said auxiliary current source means; and directing to said main current source transistor a source/sink current responsive to the result of said voltage comparison and functioning to tend to maintain the current of said one bit-current source substantially at a desired value.

11. The method as claimed in claim 10, wherein the source/sink current magnitude is proportional to the magnitude of the difference between the compared voltages.

12. The method as claimed in claim 10, wherein the transistors are all MOS transistors.

13. The method as claimed in claim 12, wherein said main transistor has a drain, said comparison being of the drain voltage of the main transistor and the drain voltage of the auxiliary current source transistor.

14. The method as claimed in claim 13, wherein said main current source transistor has a gate, said gate of said main current source transistor being connected to the drain of said main current source transistor.

* * * * *